(12) United States Patent
Meyers

(10) Patent No.: US 7,442,871 B2
(45) Date of Patent: Oct. 28, 2008

(54) PHOTOVOLTAIC MODULES FOR SOLAR CONCENTRATOR

(75) Inventor: Mark Marshall Meyers, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 570 days.

(21) Appl. No.: 10/939,925

(22) Filed: Sep. 13, 2004

(65) Prior Publication Data

US 2006/0054211 A1    Mar. 16, 2006

(51) Int. Cl.
*H01L 31/042* (2006.01)
(52) U.S. Cl. .................................. 136/246; 136/244
(58) Field of Classification Search .............. 136/246, 136/244
See application file for complete search history.

(56) References Cited

U.S. PATENT DOCUMENTS

| 4,171,695 A | * | 10/1979 | Sletten | 126/683 |
| 4,771,764 A | * | 9/1988 | Cluff | 126/577 |
| 6,020,554 A | | 2/2000 | Kaminar et al. | 136/246 |
| 6,399,874 B1 | | 6/2002 | Olah | 136/259 |

* cited by examiner

*Primary Examiner*—Alexa D. Neckel
*Assistant Examiner*—Asha Hall
(74) *Attorney, Agent, or Firm*—Fletcher Yoder

(57) ABSTRACT

An energy conversion system comprises a solar cell adapted to receive solar energy and convert the solar energy into electrical energy. The energy conversion system also comprises a solar concentrator adapted to receive solar energy and direct the solar energy to the solar cell. The solar concentrator has a lens that comprises at least one line focus section comprising an off-axis configuration, at least one spherical section adjacent to the at least one line focus section, the at least one spherical section comprising an off-axis configuration, and an unpatterned section adjacent to the at least one line focus section and the at least one spherical section.

31 Claims, 5 Drawing Sheets

PHOTOVOLTAIC MODULES FOR SOLAR CONCENTRATOR

BACKGROUND

The invention relates generally to a solar energy conversion system and, more particularly, to a photovoltaic module that converts solar energy into electrical energy.

Solar energy is considered as an alternative source of energy relative to fossil fuel energy sources in use today. At the present time, solar energy is relatively expensive compared to fossil fuels. As production of solar energy becomes more cost competitive, it is likely that solar energy will be used more widely.

Solar energy conversion modules that convert sunlight into electrical energy typically employ photovoltaic modules, photoelectric cells or solar cells, which convert solar energy into electrical energy for storage. The amount of electrical energy generated by the solar cell is directly related to the amount of solar energy the cell absorbs, which in turn is based on the size or surface area of the cell and the intensity or brightness of the sunlight that strikes the cell.

Generally, the cost of solar cells is a significant portion of the cost of components of solar energy conversion modules. This is because the solar cell is typically based on crystalline silicon, which is a relatively expensive material. Thus, increasing the size of a solar cell is a relatively expensive way to increase the electrical energy produced by the cell. The use of larger cells also results in higher transportation costs.

There is a need, therefore, for an improved technique of producing electrical energy with a photovoltaic module or photoelectric cell at reduced cost.

BRIEF DESCRIPTION

In accordance with one aspect of the present technique, an energy conversion system is provided which includes a solar cell adapted to receive solar energy and convert the solar energy into electrical energy. A solar concentrator is adapted to receive solar energy and direct the solar energy to the solar cell. The solar concentrator comprises a lens, which includes at least one line focus section comprising an off-axis configuration, at least one spherical section comprising an off-axis configuration adjacent to the line focus section, and an unpatterned section adjacent to the at least one line focus section and the at least one spherical section.

DRAWINGS

These and other features, aspects, and advantages of the present invention will become better understood when the following detailed description is read with reference to the accompanying drawings, in which like characters represent like parts throughout the drawings, wherein.

DETAILED DESCRIPTION

Figure 1:
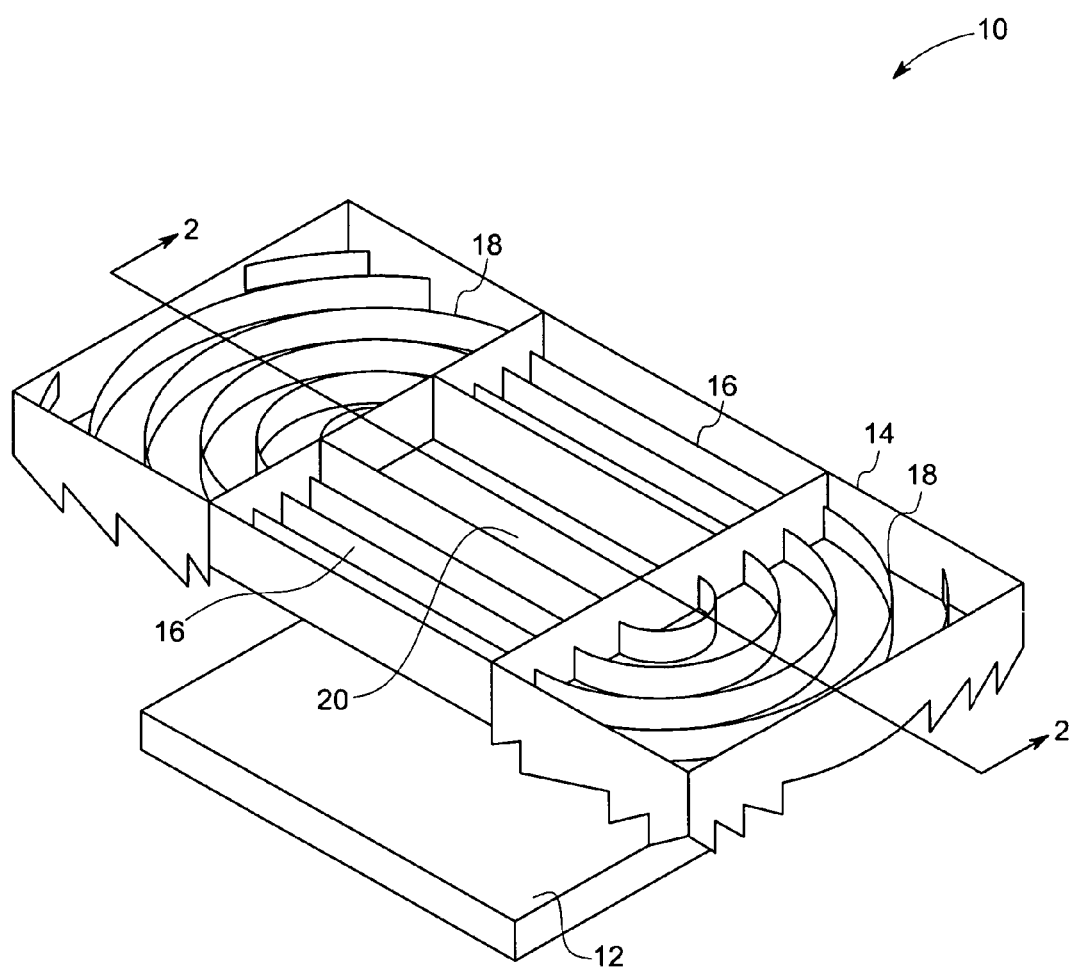
FIG. 1 is a diagrammatic representation of an energy conversion system comprising a solar concentrator and a solar cell in accordance with embodiments of the present technique.

The present technique discloses an energy conversion system adapted to receive solar energy and convert the solar energy into electrical energy. In the description of the figures below, like features are designated with like reference numerals in each figure where possible.

Turning now to the drawings, FIG. 1 illustrates a diagrammatic representation of an energy conversion system 10. Each component of the system is described in detail below.

The energy conversion system 10 comprises a solar cell 12 configured to receive sunlight and convert solar energy of the sunlight into electrical energy. Also included is a solar concentrator 14 designed to receive solar energy and direct the solar energy to the solar cell 12. The solar concentrator 14 comprises a lens comprising at least one line focus section 16 having an off-axis configuration, at least one spherical section 18 having an off-axis configuration adjacent to the at least one line focus section, and an unpatterned section 20 adjacent to the line focus section 16 and the spherical section 18.

In one embodiment, the solar concentrator 14 comprises a Fresnel lens. A Fresnel lens has a surface curvature of the lens in sections, maintaining a principal focal length of the lens similar to the conventional lens with a fraction of the weight of a conventional lens. For a thin convex lens, parallel rays of sunlight focuses to a point in the lens referred to as a principal focal point. The distance from the lens to the principal focal point is the principal focal length "f" of the lens. In the illustrated embodiment of the present technique, the spherical sections 18 of the lens, the cylindrical sections 16 of the lens and the unpatterned sections 20 of the lens are arranged in such a manner so as to obtain a maximum width for a projection of sunlight during various positions of sun in a particular day.

The line focus section 16 referred in the illustrated embodiment comprises a cylindrical section of the Fresnel lens. The unpatterned section 20 of the lens is configured to accept diffuse sunlight and direct illumination into the solar cell 12.

It should be noted that, in the present technique, although a particular arrangement of the spherical sections 18 of the lens, the cylindrical sections 16 of the lens and the unpatterned sections 20 of the lens in FIG. 1 is disclosed, it is possible to have many other arrangements of the spherical sections 18 of the lens, the cylindrical sections 16 of the lens and the unpatterned sections 20 of the lens.

Figure 2:
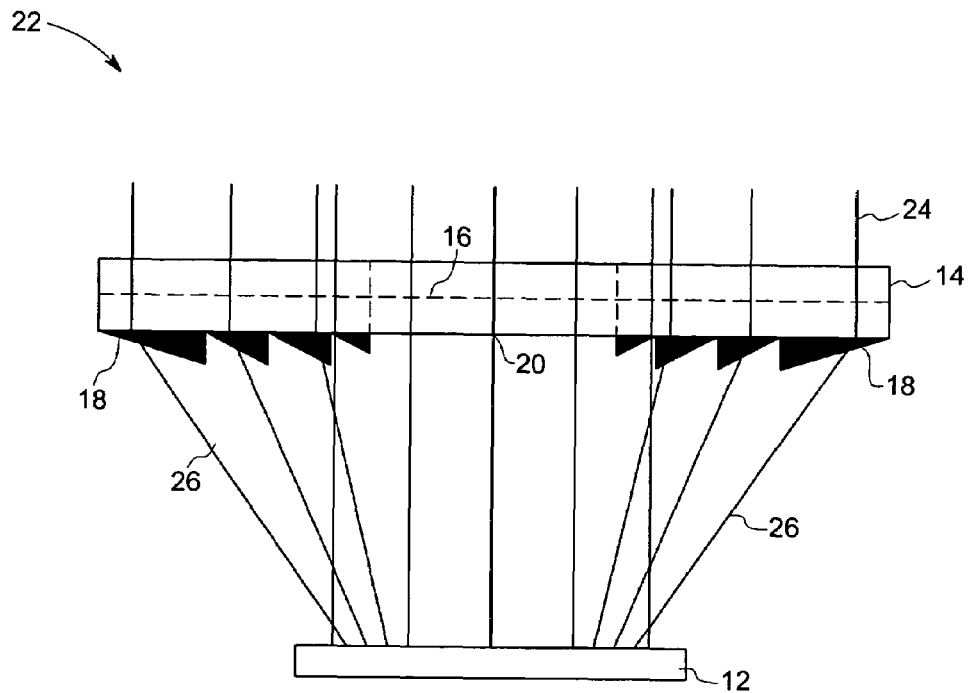
FIG. 2 is an exemplary cross-sectional diagram along axis 2-2 of a solar concentrator and a solar cell in accordance with embodiments of the present technique.

Referring generally to FIG. 2, an exemplary cross-sectional diagram 22 along axis 2-2 of FIG. 1 of the solar concentrator 14 and the solar cell 12 is explained in greater detail. In the illustrated FIG. 2, sunlight 24 is directed to the solar concentrator 14. The solar concentrator 14 comprises spherical sections 18 of the lens, the cylindrical sections 16 of the lens and the unpatterned sections 20 of the lens. The sun does not change angular position relative to latitude, as much as relative to longitude. This allows the use of the cylindrical sections 16 of the lens segment to focus the sunlight 24 parallel to the latitude along the solar cell 12. The unpatterned sections 20 of the Fresnel lens transmit the diffuse illumination from the sun 24 and unconcentrated sunlight to the solar cell 12. The unpatterned sections 20 also allow collection of scattered, diffused sunlight 24 present on hazy days to be incident on the solar cell 12 without being redirected out of the solar cell 12. The spherical sections 18 of the lens at the end (as indicated in the FIG. 2) provide more latitude for east west motion of the sun, thereby directing the sunlight 24 to the solar cell 12. The cylindrical sections 16 distribute sunlight 24 more uniformly over the surface of the solar concentrator 14 by forming a line along the length of the cell instead of a bright point. Thus, sunlight 24 directing to the solar concentrator 14 at various angles of projection are converged to the solar cell 12 in a pattern which results in low levels of concentration which does not cause any degradation in the performance of the solar cells due to excessive incident intensity.

Typical lenses are fabricated with a central mechanical and optical axis, which allows sunlight 24 to pass through without being bent or refracted. A vertex of the lens surface is on a mechanical/optical axis and the surface will be concave or convex depending on whether the lens has positive or negative focal length. The focus of a standard lens is centered on the optical axis at a distance of one back focal length from the rear lens vertex. An off axis segment of a lens or mirror is a section that is not centered on the lens optical axis. By using an off axis segment of a lens all the sunlight that would normally be incident uniformly under the lens is now focused onto the optical axis. This effectively bends rays that would be incident below the optical axis onto the optical axis of the lens. If a spherical lens is used the resultant intensity distribution is a point, while if a cylindrical lens is used, the intensity distribution is a line. In one embodiment of the present technique, the cylindrical sections 16 of the lens having an off-axis configuration (which include the mechanical center of the part and all of the upper or lower half of the cylinder) are used along the long axis of the solar cell 12 while an end caps (not labeled in FIG. 2) are formed with spherical sections 18 of the lens having an off axis configuration in the corners (upper or lower quadrant) and the cylindrical sections 16 across the width of the unpatterned section 20. In another embodiment the end caps of the solar concentrator are cylindrical sections of the lens that capture most of the sunlight 24 onto a short edge of the cylindrical sections 16 (which has the advantage of simpler manufacturing) but allow some to be focused off the solar cell 12.

The off-axis configuration of the cylindrical sections 16 and the spherical sections 18 of the lens bends 26 the sunlight 24 towards the center of the solar cell 12 for a longer fraction of day. By utilizing the off-axis configuration of the Fresnel lens, sunlight 24 is directed into the solar cell 12 at various angles of projection of the sunlight 24. This allows the solar cell 12 to be smaller in size than the solar concentrator 14 as indicated in the FIG. 2 and also reduces the thickness of the solar cell 12, thereby reducing the cost of the solar cell 12.

Typically, the cost of the solar cell 12 is dominated by the cost of the silicon or any similar material present in the solar cell 12. By reducing the total surface area of silicon utilized in building a given total wattage of solar cell 12 the cost of the system 10 is reduced. The system built for use with the concentrating optic of the present technique will utilize a smaller rectangular solar cell 12, which has a longer length along an east west direction than width along a north-south direction. These solar cells 12 may be spaced apart by greater than twice their width. In addition to this, the off-axis configuration of the spherical sections 18 and the cylindrical sections 16 of the lens allows concentration of the sunlight 24 at various angles of projection with respect to the solar cell 12. In this manner, the efficiency of the energy conversion system 10 may be improved while reducing the overall cost of the system.

Figure 3:
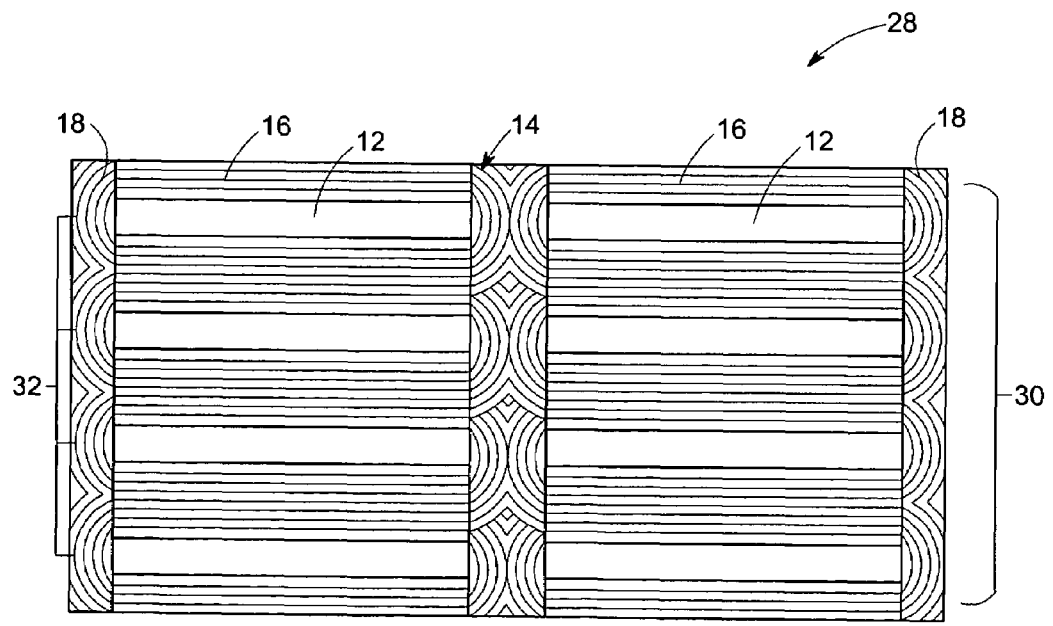
FIG. 3 is a schematic diagram illustrating an exemplary arrangement of an array of solar cells and an array of solar concentrators in accordance with an aspect of the present technique.

Referring now to FIG. 3, a diagram illustrating an exemplary arrangement of an array of solar cells 30 and an array of solar concentrators 32 is provided. In one such arrangement, multiple solar concentrators 14 and multiple solar cells 12 form an array of solar cells 30 and the array of solar concentrators 32, as represented in FIG. 3. In one example of the present technique, a pair of solar cell 12 and solar concentrator 14 may be arranged side by side, as indicated in FIG. 3. However, it should be noted that this is an exemplary arrangement and any combination and any number of solar concentrators 14 and solar cells 12 may be arranged to form the array of solar cells 30 and array of solar concentrators 32. This arrangement of the array of solar concentrators 32 and the array of solar cells 30 may provide a larger coverage of sunlight 24 to be directed to the solar cells 12, increasing the efficiency of the energy conversion unit 10.

Figure 4:
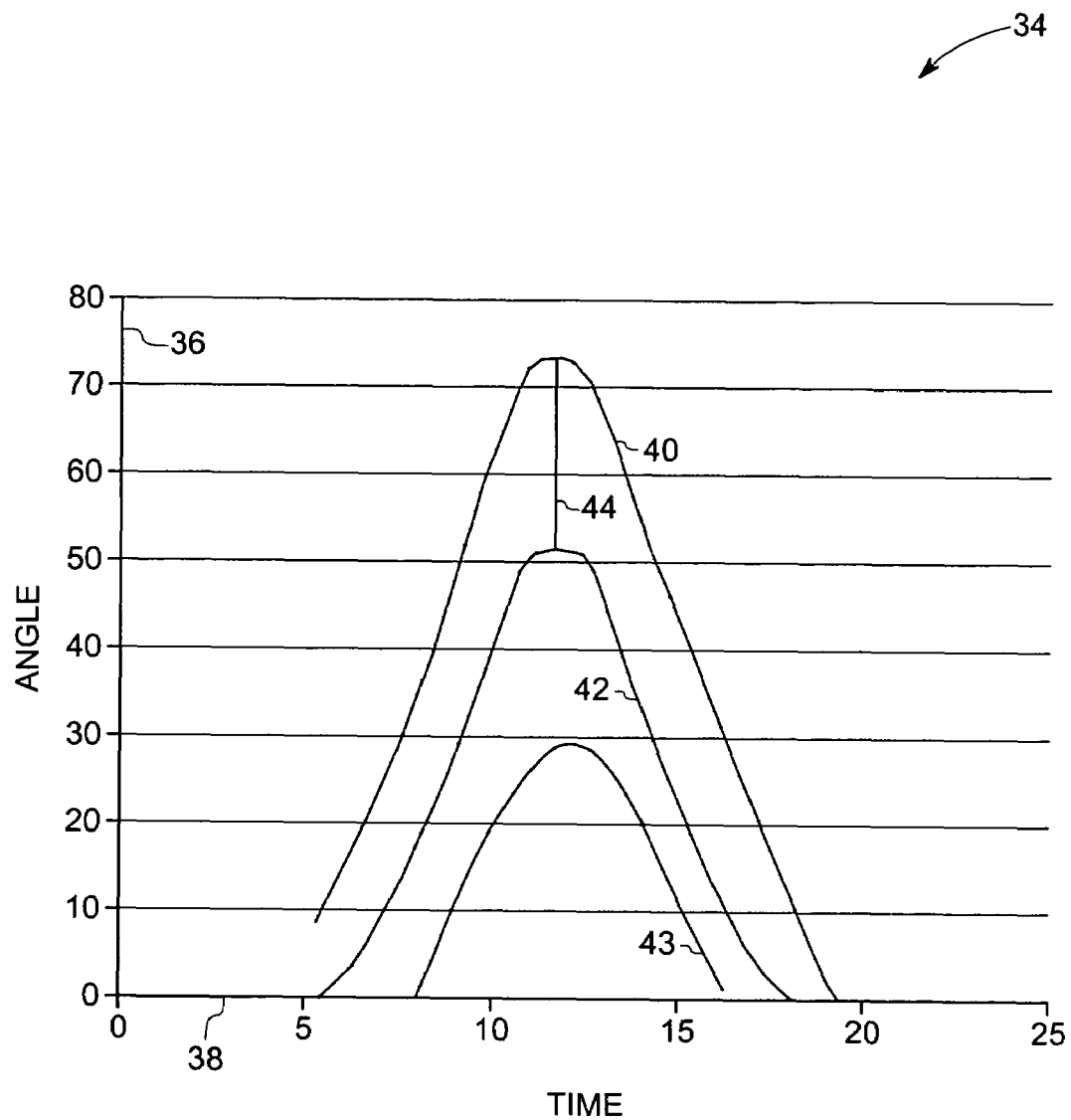
FIG. 4 is a graphical representation showing an angular projection of sun with respect to the time in a day in accordance with an aspect of the present technique.

Referring now to FIG. 4, a graphical illustration 34 of an angular projection of sun with respect to a time 38 in a day is provided. The relationship between an angular projection of the sun 34 with the time 38 of the day or a year is referred to as the solar altitude. The line represented by reference numeral 40 indicates the overall angular projection of the sun 36 with respect to the time 38 on a particular day of a particular season (summer solstice). Similarly, the line represented by reference numeral 42 indicates the overall angular projection of the sun 36 with respect to the time 38 on a particular day of another season (autumnal equinox). Reference numeral 43 indicates the overall angular projection of the sun 36 with respect to the time 38 on a particular day of yet another season (winter solstice). It may be shown experimentally that there is an approximate difference of +/−23 degrees in an overall angular projection of the sun 36 in summer solstice and autumnal equinox as indicated by reference numeral 44.

For this purpose, due to the difference in the angular projection of sun 36 in summer and in winter, multiple reflectors are employed in the energy conversion unit 10 to improve illumination for extremes of solar altitude in summer and in winter. The reflectors are arranged on either side of the solar cell 12 (as will be explained below) such that the sunlight 24 is focused to the solar cell 12 for extremes of the solar altitude. In this fashion the sunlight 24 that would fall off the upper or lower section of the solar cell 12 during the summer and winter are reflected back into the active area of the solar cell 12. These reflectors are formed with apex ½ angles that are acute with typical values being in the 15 to 30 degree range.

Figure 5:
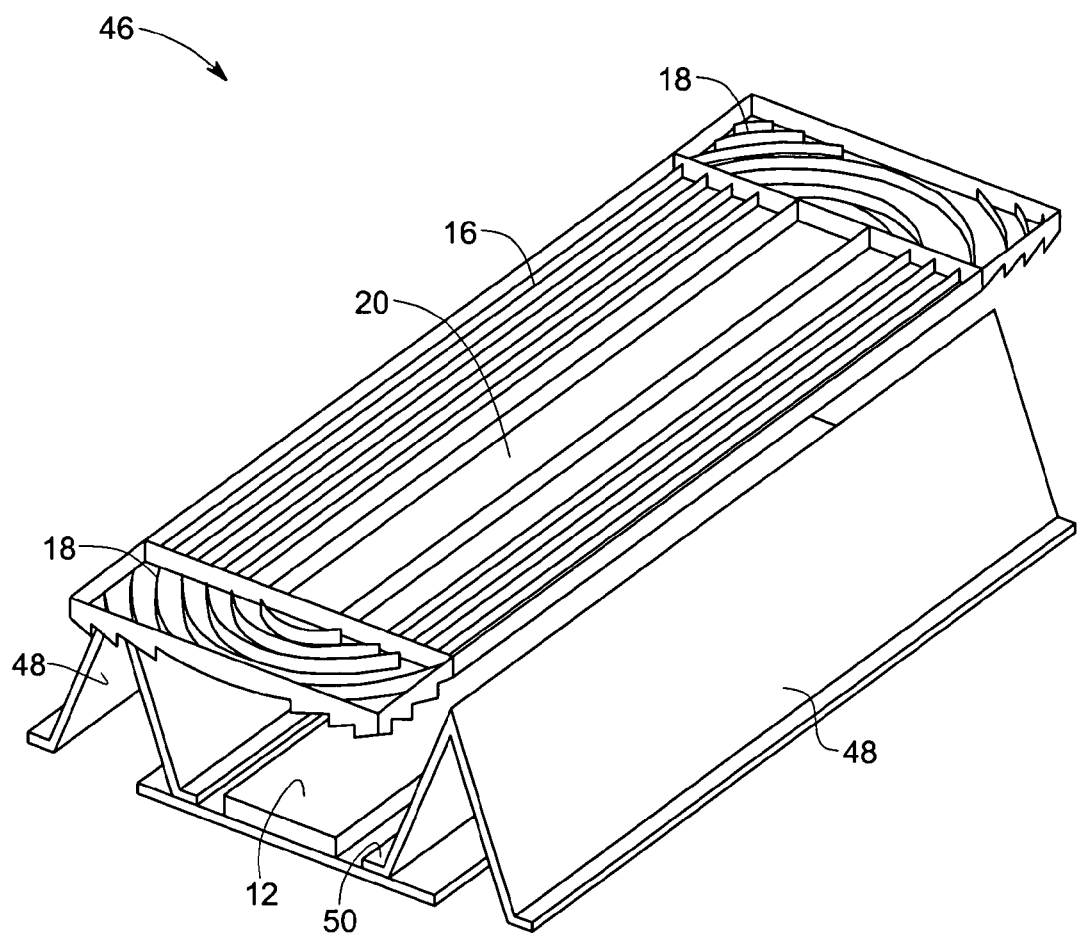
FIG. 5 is a schematic arrangement of a solar concentrator and a solar cell with reflectors in accordance with an aspect of the present technique.

FIG. 5 illustrates an exemplary schematic arrangement 46 of the solar concentrator 14 and the solar cell 12 with reflectors 48. As explained earlier, multiple reflectors 48 are arranged on either side of the solar cells 12 for concentrating the sunlight 24 for extremes of solar altitude. It should be however noted that, in another exemplary embodiment, reflectors 48 are integrated in the solar cell 12, which allows for a more versatile and modular design of the solar cell 12 (not shown in FIG. 5 for clarity). The reflectors 48 are generally provided with a stand as indicated by reference numeral 50 in the FIG. 5. This arrangement is also applicable in the array of solar cells 12 explained in FIG. 4. FIG. 5 also includes an exemplary arrangement of the solar concentrator 14 comprising of the cylindrical sections 16, the spherical sections 18 and the unpatterned sections 20 of the Fresnel lens as explained in earlier sections. However, in another embodiment of the present technique, the cylindrical sections 16 may be placed at each end of the solar concentrators 14 in place of the spherical sections 18 in the present FIG. 5. This arrangement generates a line focus of the sunlight 24 along a short end of the solar cell 12.

Figure 6:
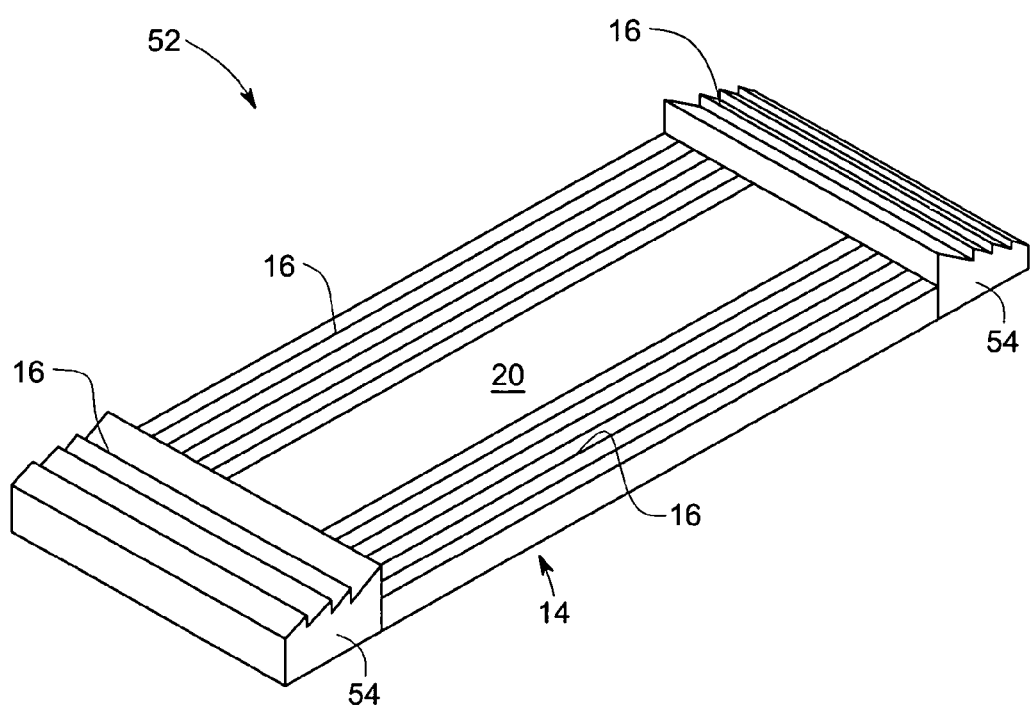
FIG. 6 is a schematic diagram illustrating an exemplary arrangement of the solar concentrators in accordance with an aspect of the present technique.

Referring now to FIG. 6, a schematic diagram illustrating an exemplary arrangement of the solar concentrators is provided. In one such arrangement, the cylindrical sections 16 of the lens having an off-axis configuration are disposed at the two end caps 54 of the solar concentrator 14. In yet another embodiment of the present technique, a combination of spherical sections 18 and cylindrical sections 16 can also be disposed at the two end caps 54 of the solar concentrator 14. These arrangements of the solar concentrators 14 are also used in the array of solar concentrators as explained in previous sections above. As will be appreciated by those skilled in the art that though the present technique discloses certain pattern of the spherical sections 18, cylindrical sections 16 and unpatterned sections 20 in the solar concentrator 14, any combination of the cylindrical sections 16, spherical sections 18 and unpatterned sections 20 can be disposed around the solar concentrator 14.

The techniques described hereinabove provide an efficient energy conversion system 10 adapted to receive the solar energy and convert the solar energy to electrical energy. The system 10 helps in reducing the size of the solar cell 12, thereby reducing the utilization of silicon in the solar cell 12 and therefore reducing the cost of the system 10. In addition to this, the system utilizes the off-axis configuration of the cylindrical sections 16 and the spherical sections 18 combined with the unpatterned sections 20 of the Fresnel lens for enabling the sunlight 24 to concentrate on the solar cell 12 at various angular projection of the sun 36 at various solar altitudes.

As will be understood by those skilled in the art, various modifications in form and detail may be made therein without departing from the scope and spirit of the present invention. For example, refractive, grin and/or diffractive lenses may be used in some embodiments, movable or adjustable lenses, mirrors, and prisms, with appropriate structure or control mechanisms, may be employed for directing the sunlight in a small angular range onto the solar cell. Further, it is not necessary that all or any of the solar cell arrays and solar concentrator arrays be of the same size. The optimum configuration may contain arrays, which are significantly similar in sizes and/or other characteristics.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An energy conversion system, comprising:
   a solar cell configured to receive solar energy and convert the solar energy into electrical energy; and
   a solar concentrator configured to receive solar energy and direct the solar energy to the solar cell, the solar concentrator comprising a lens that comprises:
      at least one line focus section comprising an off-axis configuration;
      at least one spherical section adjacent to the at least one line focus section, the at least one spherical section comprising an off-axis configuration; and
      an unpatterned section adjacent to the at least one line focus section and the at least one spherical section.

2. The system as recited in claim 1, wherein the lens comprises a section of a Fresnel lens disposed above the solar cell.

3. The system as recited in claim 1, wherein the at least one line focus section comprises a cylindrical section of a Fresnel lens.

4. The system as recited in claim 1, wherein the at least one unpatterned section is configured to distribute light uniformly over a surface of the solar cell.

5. The system as recited in claim 1, wherein the lens further comprises two line focus sections spaced apart from each other by the unpatterned section and two spherical sections spaced apart from each other by the unpatterned section.

6. The system as recited in claim 1, wherein the solar concentrator is formed as an elongated shape with the two line focus sections being at opposite ends thereof.

7. The system as recited in claim 1, wherein the solar concentrator is positioned with its ends in an east-to-west orientation.

8. The system as recited in claim 1, comprising a plurality of reflectors positioned to improve illumination for extremes of solar altitude.

9. The system as recited in claim 1, wherein the at least one line focus sections are disposed at each end of the solar concentrator.

10. The system as recited in claim 1, wherein a combination of at least the line focus section and the spherical sections are disposed at each end of the solar concentrator.

11. An array of solar collecting devices, each of the solar collecting devices comprising:
    a solar cell configured to receive solar energy and convert the solar energy into electrical energy; and
    a solar concentrator configured to receive solar energy and direct the solar energy to the solar cell, the solar concentrators comprising a lens that comprises:
       at least one line focus section comprising an off-axis configuration;
       at least one spherical section adjacent to the at least one line focus section, the at least one spherical section comprising an off-axis configuration; and
       an unpatterned section adjacent to the at least one line focus section and the at least one spherical section.

12. The array of solar collecting devices as recited in claim 11, wherein the lens comprises a section of a Fresnel lens disposed above the solar cell.

13. The array of solar collecting devices as recited in claim 11, wherein the at least one line focus section comprises a cylindrical section of a Fresnel lens.

14. The array of solar collecting devices as recited in claim 11, wherein the at least one unpatterned section is configured to distribute light uniformly over a surface of the solar cell.

15. The array of solar collecting devices as recited in claim 11, comprising two line focus sections spaced apart from each other by the unpatterned section and two spherical sections spaced apart from each other by the unpatterned section.

16. The array of solar collecting devices as recited in claim 11, wherein the solar concentrator is formed as an elongate shape with the two line focus sections being at opposite ends thereof.

17. The array of solar collecting devices as recited in claim 11, wherein the solar concentrator is positioned with its ends in an east-to-west orientation.

18. The array of solar collecting devices as recited in claim 11, comprising a plurality of reflectors positioned to improve illumination for extremes of solar altitude.

19. The array of solar collecting devices as recited in claim 11, wherein the at least one line focus sections are disposed at each end of the solar concentrator.

20. The array of solar collecting devices as recited in claim 11, wherein a combination of at least the line focus section and the spherical sections are disposed at each end of the solar concentrator.

21. A solar concentrator configured to receive solar energy and direct the solar energy to the solar cell, the solar concentrator comprising:
   a lens configured to direct solar energy comprising:
      at least one line focus section comprising an off-axis configuration;
      at least one spherical section adjacent to the at least one line focus section, the at least one spherical section comprising an off-axis configuration; and
      an unpatterned section adjacent to the at least one line focus section and the at least one spherical section.

22. The solar concentrator as recited in claim 21, wherein the solar concentrator is configured to receive sunlight such that the rays are concentrated to a solar cell.

23. The solar concentrator as recited in claim 21, wherein the lens comprises a section of a Fresnel lens disposed above the solar cell.

24. The solar concentrator as recited in claim 21, wherein the at least one line focus section comprises a cylindrical section of a Fresnel lens.

25. The solar concentrator as recited in claim 21, wherein the at least one unpatterned section is configured to distribute light uniformly over a surface of the solar cell.

26. The solar concentrator as recited in claim 21, wherein the lens further comprises two line, focus sections spaced apart from each other by the unpatterned section and two spherical sections spaced apart from each other by the unpatterned section.

27. The solar concentrator as recited in claim 21, wherein the solar concentrator is formed as an elongate shape with the two line focus sections being at opposite ends thereof.

28. The solar concentrator as recited in claim 21, wherein the solar concentrator is positioned with its ends in an east-to-west orientation.

29. The solar concentrator as recited in claim 21, comprising a plurality of reflectors positioned to improve illumination for extremes of solar altitude.

30. The solar concentrator as recited in claim 21, wherein the at least one line focus sections are disposed at each end of the solar concentrator.

31. The solar concentrator as recited in claim 21, wherein a combination of at least the line focus section and the spherical sections are disposed at each end of the solar concentrator.

* * * * *